United States Patent [19]
Nitta

[11] Patent Number: 5,848,085
[45] Date of Patent: Dec. 8, 1998

[54] SEMICONDUCTOR QUANTUM WELL STRUCTURE AND SEMICONDUCTOR DEVICE USING THE SAME

[75] Inventor: Jun Nitta, Tokyo, Japan

[73] Assignee: Canon Kabushiki Kaisha, Tokyo, Japan

[21] Appl. No.: 580,975

[22] Filed: Jan. 3, 1996

[30] Foreign Application Priority Data

Jan. 4, 1995 [JP] Japan ................................ 7-015539
Oct. 9, 1995 [JP] Japan ................................ 7-288055

[51] Int. Cl.$^6$ ................................................ H01S 3/19
[52] U.S. Cl. ........................... 372/45; 372/50; 372/23
[58] Field of Search ............................ 372/45, 50, 23; 385/11

[56] References Cited

U.S. PATENT DOCUMENTS

| | | | |
|---|---|---|---|
| 4,817,110 | 3/1989 | Tokuda ........................................ | 372/45 |
| 5,117,469 | 5/1992 | Cheung et al. ............................. | 385/11 |
| 5,151,818 | 9/1992 | Thijs et al. ................................. | 372/45 |
| 5,412,225 | 5/1995 | Dutta et al. ................................ | 257/18 |
| 5,412,678 | 5/1995 | Treat et al. ................................ | 372/50 |
| 5,465,263 | 11/1995 | Bour et al. ................................. | 372/23 |
| 5,488,507 | 1/1996 | Nishimura ................................... | 372/45 |
| 5,574,289 | 11/1996 | Aoki et al. .................................. | 372/50 |
| 5,633,514 | 5/1997 | Shiraishi et al. ........................... | 372/45 |
| 5,644,587 | 7/1997 | Kaneno et al. ............................. | 372/45 |

FOREIGN PATENT DOCUMENTS

| | | | |
|---|---|---|---|
| 0400559 | 12/1990 | European Pat. Off. | .... H01L 31/0352 |
| 0420749 | 4/1991 | European Pat. Off. | .... H01L 31/0352 |
| 4-291982 | 10/1992 | Japan ........................................ | 372/45 |

OTHER PUBLICATIONS

Applied Physics Letters, vol. 61, No. 24, Dec. 14, 1992, pp. 2845–2847, XP000335086, A. Mathur et al.: "Polarization Insensitive Strained Quantum Well Gain Medium for Lasers and Optical Amplifiers".

Applied Physics Letters, vol. 61, No. 15, Oct. 12, 1992, pp. 1772–1774, XP00316464, M.P.C.M. Krijn et al.: "Improved Performance of Compressively as Well as Tensile Strained Quantum–well Lasers".

IEEE Journal of Quantum Electronics, vol. 30, No. 2, Feb. 1994, pp. 524–532, XP0000449502, Tkamijoh et al.: Improved Operation Characteristics of Long–Wavelength Lasers Using Strained MQW Active Layers.

Electronics Letters, vol. 30, No. 11, May 26, 1994, pp. 900–901, XP0000465063, I.K. Czajkowski et al.,: "Strain–compensated MQW Electro–absorption Modulator for Increased Optical Power Handling".

Journal Of Applied Physics, vol. 76, No. 6, Sep. 15, 1994, pp. 3250–3254, XP002018987, S. Seki et al.: "The Effects of Strain on the Threshold Current Density inGaAsP/Inp Strained–layer Single–Quantum–Well Lasers".

*Primary Examiner*—Rodney Bovernick
*Assistant Examiner*—Yisun Song
*Attorney, Agent, or Firm*—Fitzpatrick, Cella, Harper & Scinto

[57] ABSTRACT

A semiconductor quantum well structure having at least two quantum wells, each having an electron quantum level, a heavy hole quantum level and a light hole quantum level. In the two quantum wells, only their respective heavy hole quantum levels or their respective light hole quantum levels coincide with each other. Further, there is a construction in which a barrier portion between the two quantum wells has a thickness and a band gap which allow connecting the wave functions of the respective electrons between the two quantum wells. Alternatively, the thickness and band gap of the barrier allow the connection between the quantum wells of the wave functions of those holes whose quantum levels coincide with each other. In order to set the hole quantum level to a desired quantum level, a specific construction imparts an appropriate strain to the quantum wells.

31 Claims, 6 Drawing Sheets

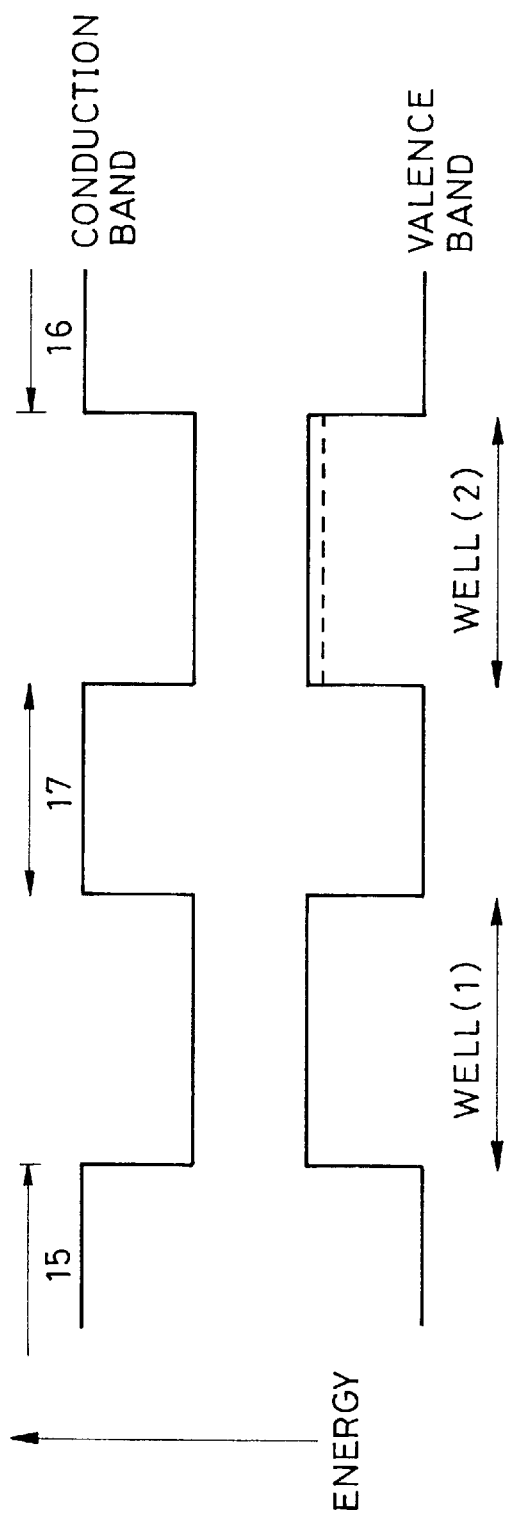

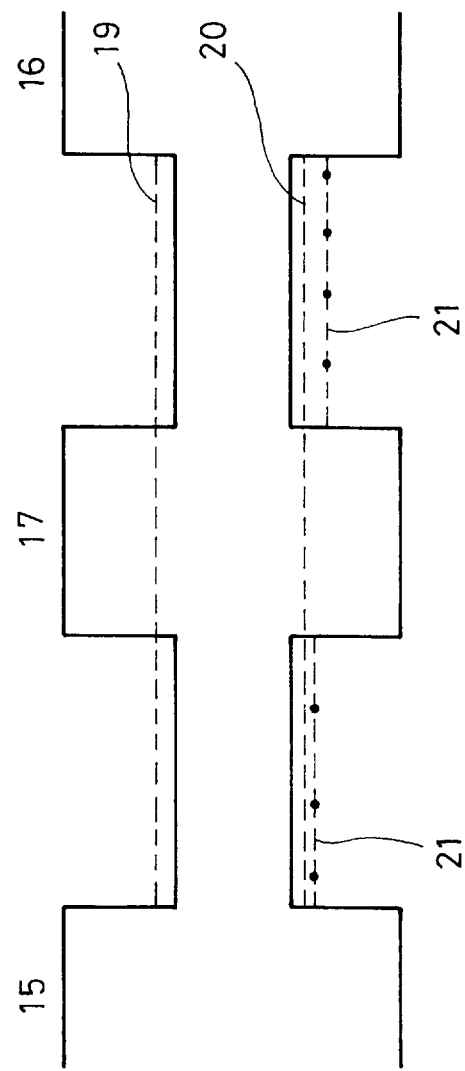

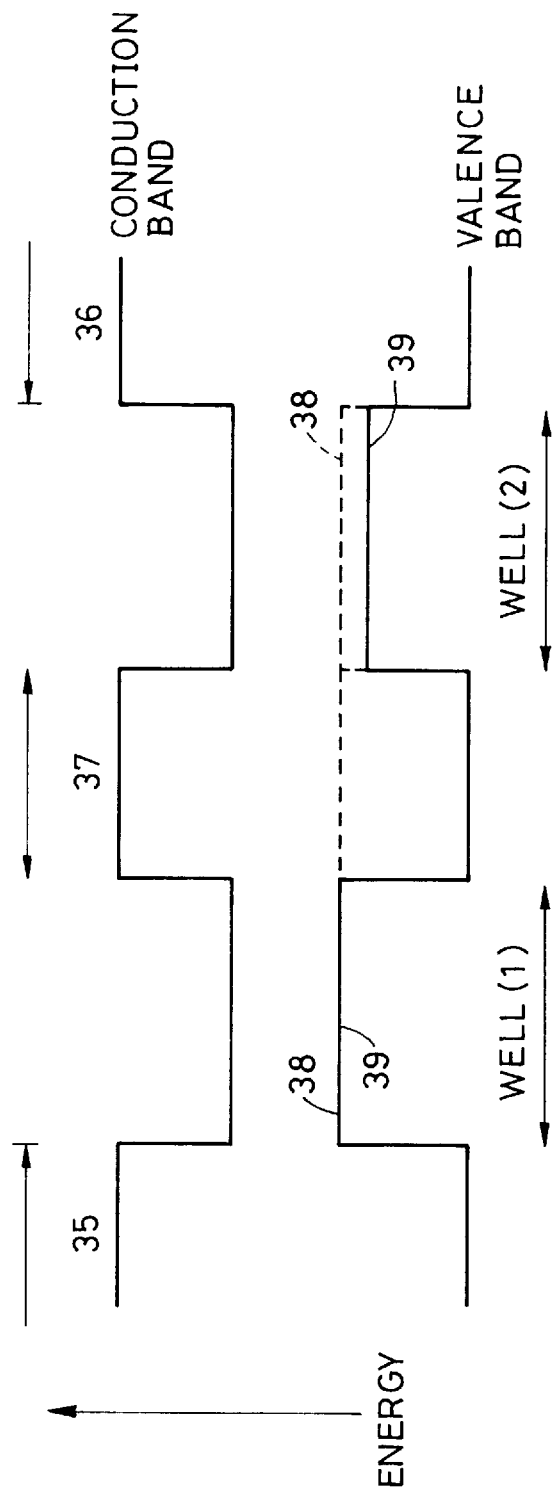

SEMICONDUCTOR QUANTUM WELL STRUCTURE AND SEMICONDUCTOR DEVICE USING THE SAME

BACKGROUND OF THE INVENTION

1. Field of the Invention

The present invention relates to a semiconductor quantum well structure and, more specifically, to a semiconductor quantum well structure formed by stacking semiconductor layers having different band gaps. The present invention further relates to a semiconductor device using such a quantum well structure.

2. Description of the Related Art

An example of the conventional semiconductor device using a strain quantum well is a semiconductor laser. In a semiconductor laser, to achieve an improvement in performance by, for example, reducing the effective mass of the holes in the valence band, a semiconductor whose lattice constant is larger than that of the substrate is used in the well portion of the quantum well forming the active layer, making it possible to introduce a biaxial compressive strain. By introducing a compressive strain, it is possible to reduce the threshold value of the transverse electric (TE) light oscillation of the semiconductor laser and, further, to attain an improvement in terms of modulation characteristics.

However, in the above prior-art example, when the width of the quantum well is enlarged for the purpose of attaining an increase in gain, the quantum level of the heavy holes and that of the light holes approach each other, with the result that the effect of the introduction of a strain is diminished. Further, the value of the film thickness (the critical film thickness) which allows growth of a substance with a lattice constant different from that of the substrate is restricted, and, in a quantum well containing a material whose lattice constant is different from that of the substrate, there are limitations in terms of an increase in film thickness and degree multiplicity.

SUMMARY OF THE INVENTION

It is an object of the present invention to provide a semiconductor quantum well structure in which the above problems have been solved and a semiconductor device including such a semiconductor quantum well structure.

In accordance with the present invention, there is provided a semiconductor quantum well structure which includes at least two quantum wells, each having an electron quantum level, a heavy hole quantum level and a light hole quantum level, wherein, in these two quantum wells, only either their respective heavy hole quantum levels or their respective light hole quantum levels coincide with each other. In the present invention, it has been observed that an effect is obtained through an increase in quantum well width with respect to those holes whose quantum levels coincide with each other. To realize such an effect, the thickness and the band gap of the barrier layer portion between the two quantum wells are determined such that the wave functions of the electrons of the two quantum wells can be connected together and that the wave functions of those holes of the two quantum wells whose levels coincide with each other can be connected together.

More specifically, the composition ratios of the semiconductors forming the two quantum wells may be different from each other. Alternately, the semiconductor forming one of the two quantum wells may contain at least one semiconductor material which is not contained in the semiconductor forming the other quantum well.

As a specific construction for quantum level control, it is possible to adopt a construction in which a strain effect is only applied to one of the two quantum wells. The strain effect may be the effect of a compressive strain or the effect of a tensile strain. Further, in the above-described two quantum wells, it is also possible to adopt a construction in which a strain effect is applied to each of the two wells, with the strain effect applied to one well being different from that applied to the other well. In this case, the respective amounts of compressive strain applied to the quantum wells may be different, or the respective amounts of tensile strain applied to the quantum wells may be different. Alternatively, the strain effect applied to one of the two quantum wells may be the effect of a compressive strain, and the strain effect applied to the other being the effect of a tensile strain.

Whether a strain effect in a semiconductor is a compressive strain effect or a tensile strain effect is determined by the deviation of the lattice constant of the semiconductor from a reference lattice constant; that is, it is determined according as to whether the lattice constant of the semiconductor is larger or smaller than the reference lattice constant. The degree of strain effect is determined by the degree of this deviation. Thus, a strain effect as mentioned above can be appropriately imparted by controlling the composition ratio of the semiconductor forming the quantum well. The composition ratio of the semiconductor is controlled to the extent that the lattice constant of the semiconductor becomes a desired lattice constant. As the reference lattice constant, it is expedient to use the lattice constant of the substrate forming the quantum well structure.

According to another aspect of the present invention, the above-described semiconductor quantum well structure is applicable to various semiconductor devices including a quantum well structure. For example, it is possible to construct a semiconductor laser including a semiconductor quantum well structure as described above in at least a part of the active layer thereof. Further, the above quantum well structure is also applicable to other semiconductor optical devices, such as a semiconductor light amplifier and semiconductor light modulator.

BRIEF DESCRIPTION OF THE DRAWINGS

FIG. 1 is a band diagram showing a quantum well structure according to a first embodiment of the present invention;

FIG. 3 is a diagram showing the energy levels in the quantum well structure of FIG. 1;

FIG. 6 is a band diagram showing a quantum well structure according to a third embodiment of the present invention.

DETAILED DESCRIPTION OF THE PREFERRED EMBODIMENTS (First Embodiment)

Figure 2A:
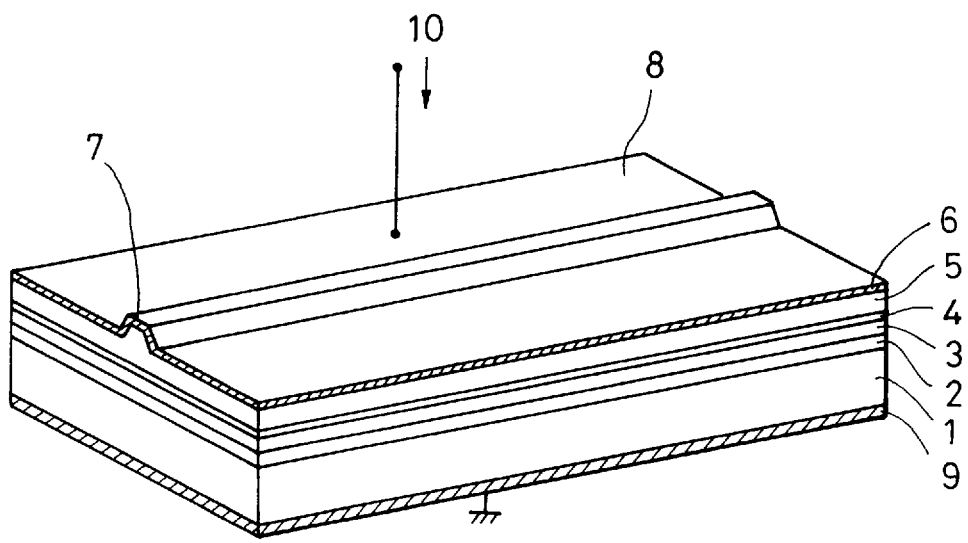
FIG. 2A is a perspective view of a semiconductor laser having in the active layer thereof a quantum well structure as shown in FIG. 1.
Figure 2B:
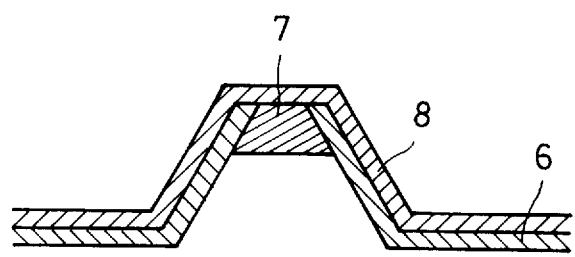
FIG. 2B is a detailed view of the cap layer portion.

FIGS. 1 and 2 are diagrams most clearly illustrating the features of the present invention. FIG. 2 shows a semiconductor laser to which the present invention is applied, and FIG. 1 is a band diagram of a part of FIG. 2. In FIG. 2, numeral 1 indicates a substrate which is formed, for example, of n-InP; numeral 2 indicates a buffer layer formed, for example, of n-InP; numeral 3 indicates a clad layer which is formed, for example, of n-InP; numeral 4 indicates an active layer; numeral 5 indicates a clad layer which is formed, for example, of p-InP; numeral 6 indicates an insulating layer which is formed, for example, of $SiO_2$; numeral 7 indicates a cap layer which is formed, for example, of p-InGaAs; numerals 8 and 9 indicate electrodes for supplying electric current to the active layer 4; and numeral 10 indicates an electric current. In this embodiment, a ridge waveguide is used as the lateral waveguide structure of the semiconductor laser. Of course, this waveguide structure may be of any other type, e.g., the buried type, as long as it can form a semiconductor laser.

The construction of the active layer 4 is shown in FIG. 1. The active layer 4 as shown in FIG. 1 in which there are provided two quantum wells between separate confinement hetero structure (SCH) layers 15 and 16 of p and n-type InGaAsP (1.3 μm composition). The quantum wells comprise a well (1) consisting, for example, of a layer of $In_{0.53}Ga_{0.47}As$ having a thickness of 10 nm, a well (2) consisting, for example, of a layer of $In_{0.62}Ga_{0.38}As_{0.9}P_{0.1}$ having a thickness of 10 nm, and a barrier layer 17 situated between the wells (1) and (2) and consisting, for example, of a layer of InGaAsP (1.3 μm composition) having a thickness of 7 nm.

In this construction, the well (2) is formed of a material whose lattice constant is somewhat larger than that of the substrate. When, as in this embodiment, epitaxial growth is effected, an in-plane compressive stress is generated by a lattice mismatching of approximately 0.29%, resulting in a strain effect.

A semiconductor crystal under an in-plane stress undergoes a change in band gap with respect to the light and heavy holes as shown below:

Heavy Holes:

$$E_{gHH} = E_{g0} + a(2\epsilon_{xx} - 2(c_{12}/c_{11})\epsilon_{xx}) - b(\epsilon_{xx} + 2(c_{12}/c_{11})\epsilon_{xx})$$

Light Holes:

$$E_{gLH} = E_{g0} + a(2\epsilon_{xx} - 2(c_{12}/c_{11})\epsilon_{xx}) + b(\epsilon_{xx} + 2(c_{12}/c_{11})\epsilon_{xx})$$

where $E_{g0}$ is the band gap when there is no in-plane stress; $\epsilon_{xx}$ is the degree of lattice mismatching $(((a-a_0)/a_0);$ it will be assumed that $a_0$ is the lattice constant of the substrate, and that a is the lattice constant of the semiconductor crystal under in-plane stress); a and b are deformation potentials; and $a_{11}$ and $C_{12}$ are stiffness constants.

For example, the well depth for the heavy holes is obtained as follows, taking the band offset ratio into consideration:

$$\alpha E_{gb} - \alpha E_{g0} - \alpha a(2\epsilon_{xx} - 2(c_{12}/c_{11})\epsilon_{xx}) + b(\epsilon_{xx} + 2(c_{12}/c_{11})\epsilon_{xx})$$

where α is the band offset ratio, and $E_{gb}$ is the band gap of the barrier (The barrier is in lattice matching).

Similarly, the well depth for the light holes can be obtained as follows:

$$\alpha E_{gb} - \alpha E_{g0} - \alpha a(2\epsilon_{xx} - 2(c_{12}/c_{11})\epsilon_{xx}) - b(\epsilon_{xx} + 2(c_{12}/c_{11})\epsilon_{xx})$$

In this embodiment, due to the in-plane compressive stress, the well (2) has a band gap between first level of conduction band 19 and first level of heavy hole 20, which is approximately the same as that of the well (1) and a band gap between first level of conduction band 19 and first level of light hole 21 is larger than the same as that of the well (1) by approximately 0.02 eV (that is, the well (2) is shallower than the well (1) with respect to the light holes).

Due to the effect of the lattice mismatching as described above, the prepared quantum well has a double quantum well structure with respect to the heavy holes, and an asymmetrical double quantum well structure with respect to the light holes. Moreover, when the thickness of the barrier 17 is small, as in this construction, the two wells (1) and (2) are connected together. In that case, the level of the conduction band of the same energy level and the level of the heavy holes of the valence band are connected, and the level of the light holes is not connected. The quantum levels at this time are as shown in FIG. 3; a just level of conduction band 19, a just level of heavy holes 20 (both shown in broken lines) and a just level of light holes (shown in dotted broken lines) 21. As a result, when electric current is supplied, the transition between the first level of the conduction band and the first level of the heavy holes of the valence band is considerably predominant. The transition in which the light holes are involved is diminished.

Due to the above construction, it is possible to reduce the threshold value of the transverse electric (TE) light oscillation of the semiconductor laser of FIG. 2 and, further, an improvement in modulation characteristics can be achieved. In this way, the level of the light holes and that of the heavy holes do not approach each other, so that it is possible to achieve an increase in gain without diminishing the effect of strain introduction, whereby the width of the quantum well can be substantially increased.

(Second Embodiment)

Figure 4:
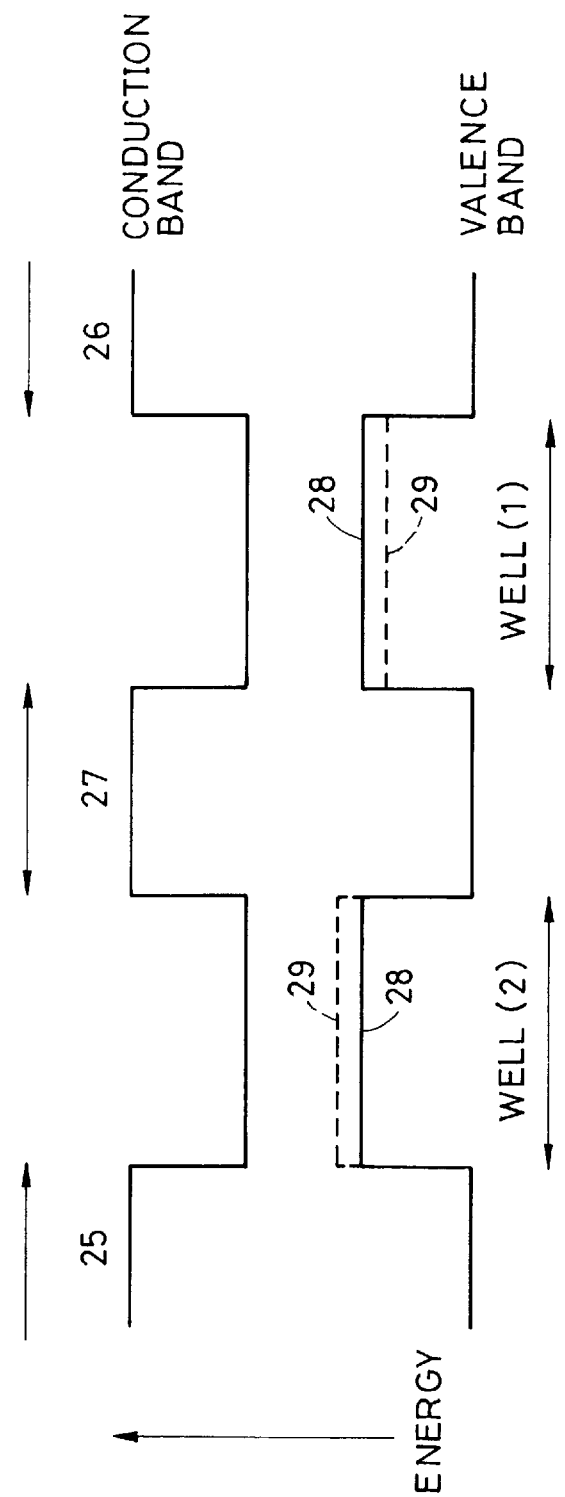
FIG. 4 is a band diagram showing a quantum well structure according to a second embodiment of the present invention.

FIG. 4 is a diagram for illustrating a second embodiment of the present invention. The drawing, which corresponds to FIG. 1 illustrating the first embodiment, shows a band diagram of a quantum well portion. Apart from this portion, the construction of the ridge waveguide type semiconductor laser of the first embodiment, shown in FIG. 2, is used.

In this embodiment, the well (1) consists, for example, of a layer of $In_{0.905}Ga_{0.095}As_{0.3}P_{0.7}$ having a thickness of 8 nm, the well (2) consists, for example, of a layer of $In_{0.8}Ga_{0.2}As_{0.4}P_{0.6}$ having a thickness of 8 nm, and the barrier 27 between the two wells consists, for example, of a layer of $In_{0.91}Ga_{0.09}As_{0.2}P_{0.8}$ (1.0 μm composition). In the case of this construction, a compressive strain of approximately 0.30% is applied to the well (1) due to a difference in lattice constant between the well layer and the substrate (InP). Similarly, a tensile strength of approximately 0.117% is applied to the well (2). As a result of these strains, the band gaps of the wells undergo a variation. In FIG. 4, the band end of the heavy holes 28 is indicated by solid lines, and the band end of the light holes 29 is indicated by broken lines. The SCH layer on either side has the construction of InGaAsP (1 μm composition).

As can be seen from FIG. 4, there are formed wells of the same depth with respect to the heavy holes and electrons (double quantum well), whereas, with respect to the light holes, there are two wells of different depths (asymmetrical double quantum well). In such a construction, the transition between the heavy holes and electrons is predominant, as described with reference to the first embodiment.

Figure 5:
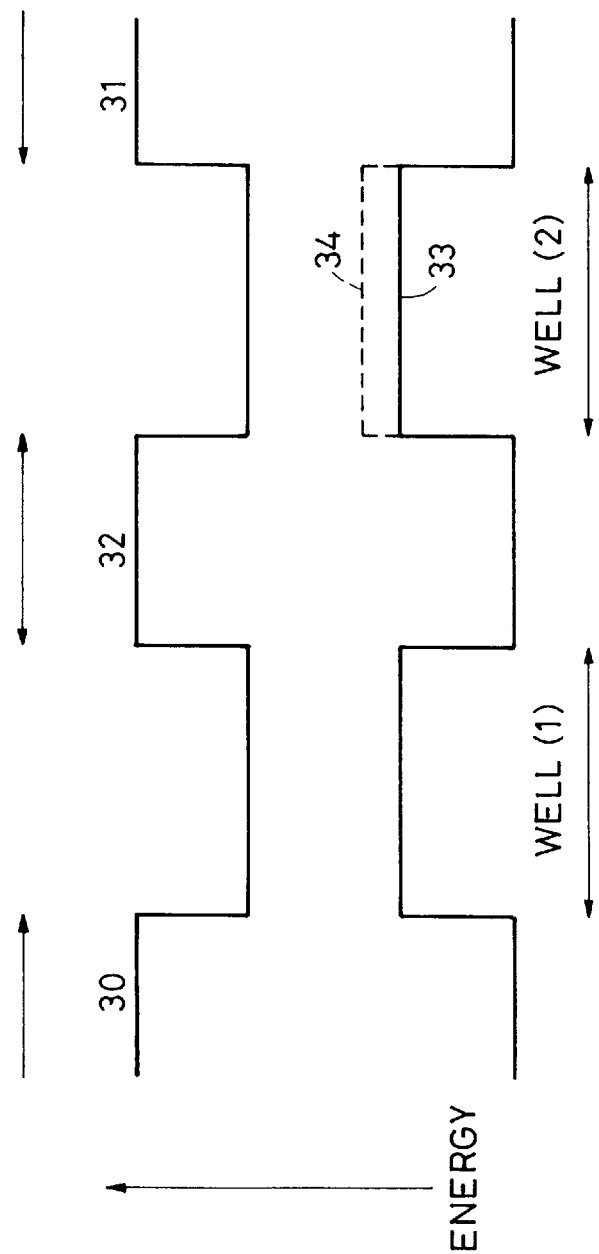
FIG. 5 is a band diagram showing a quantum well structure according to another embodiment of the present invention.

FIG. 5 shows another example of quantum well construction. In this case, the well (1) is formed of $Ga_{0.14}In_{0.86}As_{0.3}P_{0.7}$, which is a material in lattice matching with the substrate 1. The well (2) is formed, for example, of $Ga_{0.8}In_{0.2}As$ and has a smaller lattice constant than the substrate, and a tensile strain of approximately 2.2% is applied to the well (2). As a result, in the well (2), the band gap with respect to the heavy holes 33 is different from the band gap with respect to the light holes 34 (The broken line shown in FIG. 5 represents the band end for the light holes). Accordingly, as in the embodiment described above, the transition between the heavy holes and electrons is predominant. The SCH 30 and 31 on either side of the barrier 32 has the construction InGaAsP and a thickness of 0.95 $\mu$m.

(Third Embodiment)

In the above described embodiments, the heavy hole levels substantially coincide with each other between a plurality of wells, whereas the light hole levels do not coincide. A construction example which is the reverse to the above case, that is, a case in which the light hole levels coincide with each other and in which the heavy hole levels do not coincide will now be described. The basic construction is the same as those shown in FIGS. 1 and 2 except for the construction of the active layer 4. The well (1) consists, for example, of a layer of $In_{0.53}Ga_{0.47}As$ having a thickness of 10 nm, and the well (2) consists, for example, of a layer of $In_{0.28}Ga_{0.72}As$ having a thickness of 10 nm. In the case of this construction, the well (2) has a lattice mismatching to a degree of 1.7% and is under an in-plane tensile stress, the band gaps with respect to the heavy and light holes being different from each other. In this construction, the quantum wells are formed such that the wells (1) and (2) have the same depth with respect to the light holes, and different depths with respect to the heavy holes (The well (2) is shallower by approximately 0.13 eV).

In FIG. 6, the band end of the heavy holes is indicated by solid lines 39, and the band end of the light holes is indicated by broken lines 38, (the solid line 39 and the broken line 38 is overlapping at well (1)).

Although the above embodiments have been described with reference to devices in which the quantum well structure of the present invention is applied to a semiconductor laser structure, the range of application of the present invention is not limited thereto. The present invention is also applicable to any other type of conventional device as long as it contains a quantum well structure, for example, a light modulator using a quantum well structure. Further, by forming an anti-reflection film on either end surface of the semiconductor laser shown with reference to the embodiments, it is possible to construct a traveling-wave-type semiconductor laser amplifier having a high amplification factor with respect to transverse electric (TE) light, transverse magnetic (TM) light, etc.

Further, while the above embodiments have been described with reference to the case in which two wells are used in constructing the structure, it is also possible for these two wells to constitute one of a plurality of pairs of wells forming a well structure. Further, the present invention is also easily applicable to a structure having three or more wells.

As described above, in accordance with the present invention, a coincidence of electron levels is achieved with respect to a plurality of wells, and a coincidence of levels is achieved with respect to only either light or heavy holes, whereby it is possible to separate the level of heavy holes from that of light holes in a quantum well structure of a larger thickness and a higher degree of multiplicity than in the prior art.

Accordingly, while the present invention has been described with respect to what is presently considered to be the preferred embodiments, it is to be understood that the invention is not limited to the disclosed embodiments. To the contrary, the invention intended to cover the various modifications and equivalent arrangements included within the spirit and scope of the appended claims. The scope of the following claims is to be accorded to the broadest interpretation so as to encompass all such modifications and equivalent structures and functions.

What is claimed is:

1. A semiconductor quantum well structure comprising:
    at least two quantum wells which are stacked, each having an electron quantum level, a heavy hole quantum level and a light hole quantum level,
    wherein, in said at least two quantum wells, either their respective heavy hole quantum levels coincide with each other or their respective light hole quantum levels coincide with each other.

2. A semiconductor quantum well structure according to claim 1, further comprising a barrier portion between said two quantum wells having a thickness and a band gap wherein between said at least two quantum wells the wave functions of their respective electrons connect, and wherein between said at least two quantum wells the wave functions of those holes whose quantum levels coincide with each other connect.

3. A semiconductor quantum well structure according to claim 1, wherein said at least two quantum wells are respectively formed of semiconductors having different composition ratios.

4. A semiconductor quantum well structure according to claim 3, wherein the semiconductor forming one of said at least two quantum wells contains at least one semiconductor material which is not contained in the semiconductor forming the other quantum well.

5. A semiconductor quantum well structure according to claim 1, wherein only one of said at least two quantum wells is under a strain effect.

6. A semiconductor quantum well structure according to claim 5, wherein said strain effect is a compressive strain effect.

7. A semiconductor quantum well structure according to claim 5, wherein said strain effect is a tensile strain effect.

8. A semiconductor quantum well structure according to claim 1, wherein each of said at least two quantum wells is under a strain effect, with the respective strain effects applied to the at least two quantum wells being different from each other.

9. A semiconductor quantum well structure according to claim 8, wherein said strain effect is a compressive strain effect, with the respective strain amounts applied to the at least two quantum wells being different from each other.

10. A semiconductor quantum well structure according to claim 8, wherein said strain effect is a tensile strain effect, with the respective strain amounts applied to the at least two quantum wells being different from each other.

11. A semiconductor quantum well structure according to claim 8, wherein the strain effect applied to one of said at least two quantum wells is a compressive strain effect, and the strain effect applied to the other quantum well is a tensile strain effect.

12. A semiconductor device including a semiconductor quantum well structure comprising:
    at least two quantum wells which are stacked, each having an electron quantum level, a heavy hole quantum level and a light hole quantum level,
    wherein, in said at least two quantum wells, either their respective heavy hole quantum levels coincide with each other or their respective light hole quantum levels coincide with each other.

13. A semiconductor quantum well structure according to claim 12, further comprising a barrier portion between said two quantum wells have a thickness and a band gap wherein between said at least two quantum wells the wave functions of their respective electrons connect, and wherein between said at least two quantum wells the functions of those holes whose quantum levels coincide with each other connect.

14. A semiconductor device according to claim 12, wherein said at least two quantum wells are respectively formed of semiconductors having different composition ratios.

15. A semiconductor device according to claim 14, wherein the semiconductor forming one of said at least two quantum wells contains at least one semiconductor material which is not contained in the semiconductor forming the other quantum well.

16. A semiconductor device according to claim 12, wherein only one of said at least two quantum wells is under a strain effect.

17. A semiconductor device according to claim 16, wherein said strain effect is a compressive strain effect.

18. A semiconductor device according to claim 16, wherein said strain effect is a tensile strain effect.

19. A semiconductor device according to claim 12, wherein each of said at least two quantum wells is under a strain effect, with the respective strain effects applied to the at least two quantum wells being different from each other.

20. A semiconductor device according to claim 19, wherein said strain effect is a compressive strain effect, with the respective strain amounts applied to the at least two quantum wells being different from each other.

21. A semiconductor device according to claim 19, wherein said strain effect is a tensile strain effect, with the respective strain amounts applied to the at least two quantum wells being different from each other.

22. A semiconductor device according to claim 19, wherein the strain effect applied to one of said at least two quantum wells is a compressive strain effect, and wherein the strain effect applied to the other quantum well is a tensile strain effect.

23. A semiconductor device according to claim 12, wherein the device is a semiconductor laser.

24. A semiconductor device according to claim 12, wherein the device is a semiconductor light amplifier.

25. A semiconductor device according to claim 12, wherein the device is a semiconductor light modulator.

26. A semiconductor quantum well structure comprising:
   at least two quantum wells which are stacked, each having an electron quantum level, a heavy hole quantum level and a light hole quantum level,
   wherein, in said at least two quantum wells, either their respective heavy hole quantum levels or their respective light hole quantum levels coincide with each other, and thereby the same effect is given as increasing the width of a quantum well with respect to the coincident hole quantum levels.

27. A semiconductor device including a semiconductor quantum well structure comprising:
   at least two quantum wells which are stacked, each having an electron quantum level, a heavy hole quantum level and a light hole quantum level,
   wherein, in said at least two quantum wells, either their respective heavy hole quantum levels coincide with each other or their respective light hole quantum levels coincide with each other.

28. A semiconductor quantum well structure according to claim 1, wherein said two quantum wells have a double quantum well structure with respect to one of heavy holes or light holes of which quantum levels coincide with each other, and an asymmetrical double quantum well structure with respect to the other holes.

29. A semiconductor quantum well structure according to claim 12, wherein said two quantum wells have a double quantum well structure with respect to one of heavy holes or light holes of which quantum levels coincide with each other, and an asymmetrical double quantum well structure with respect to the other holes.

30. A semiconductor quantum well structure according to claim 26, wherein said two quantum wells have a double quantum well structure with respect to one of heavy holes or light holes of which quantum levels coincide with each other, and an asymmetrical double quantum well structure with respect to the other holes.

31. A semiconductor quantum well structure according to claim 27, wherein said two quantum wells have a double quantum well structure with respect to one of heavy holes or light holes of which quantum levels coincide with each other, and an asymmetrical double quantum well structure with respect to the other holes.

* * * * *